United States Patent
Kasahara et al.

(10) Patent No.: US 6,797,543 B2
(45) Date of Patent: Sep. 28, 2004

(54) PROCESS FOR MANUFACTURING IC CARD

(75) Inventors: Tetsuichiro Kasahara, Nagano (JP);
Hirokazu Tsukioka, Nagano (JP);
Shintaro Hayashi, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 10/610,526

(22) Filed: Jul. 2, 2003

(65) Prior Publication Data

US 2004/0023435 A1 Feb. 5, 2004

Related U.S. Application Data

(63) Continuation of application No. 09/407,303, filed on Sep. 29, 1999, now Pat. No. 6,630,370.

(30) Foreign Application Priority Data

Oct. 2, 1998 (JP) .......................................... 10-281350

(51) Int. Cl.[7] .............................................. H01L 23/28
(52) U.S. Cl. ...................................... 438/118; 438/124
(58) Field of Search ................................. 438/118, 124, 438/FOR 379

(56) References Cited

U.S. PATENT DOCUMENTS

| 5,399,847 A | 3/1995 | Droz |
| 5,851,854 A | * 12/1998 | Haghiri-Tehrani et al. .. 438/118 |
| 5,852,289 A | 12/1998 | Masahiko |
| 6,025,054 A | 2/2000 | Tiffany, III |
| 6,048,576 A | 4/2000 | Hwail et al. |
| 6,111,303 A | * 8/2000 | Launay ........................ 257/531 |

FOREIGN PATENT DOCUMENTS

| DE | 43 11 193 | 10/1994 |
| EP | 0 821 406 | 1/1998 |
| FR | 2 743 649 | 7/1997 |
| JP | 6-310324 | 11/1994 |
| WO | 97 42598 | 11/1997 |

* cited by examiner

Primary Examiner—George Fourson
Assistant Examiner—Joannie Adelle Garcia
(74) Attorney, Agent, or Firm—Staas & Halsey LLP

(57) ABSTRACT

A process for manufacturing an IC card includes a step of forming a plane coil by etching or punching a thin metal plate so that the plane coil consists of a conductor line wound as several loops in substantially the same plane and has respective terminals. A semiconductor element having electrodes is mounted on the plane coil. An adhesive agent or tape is attached to a predetermined area of the plane coil so that adjacent conductor lines in the loops are kept a predetermined gap therebetween. The plane coil is disposed between a pair of films to cover the plane coil therebetween, one of the films being provided with adhesive layer on a surface facing to the other film to seal the plane coil with the semiconductor element by attaching the pair of films with respect to each other by means of the adhesive layer.

17 Claims, 15 Drawing Sheets

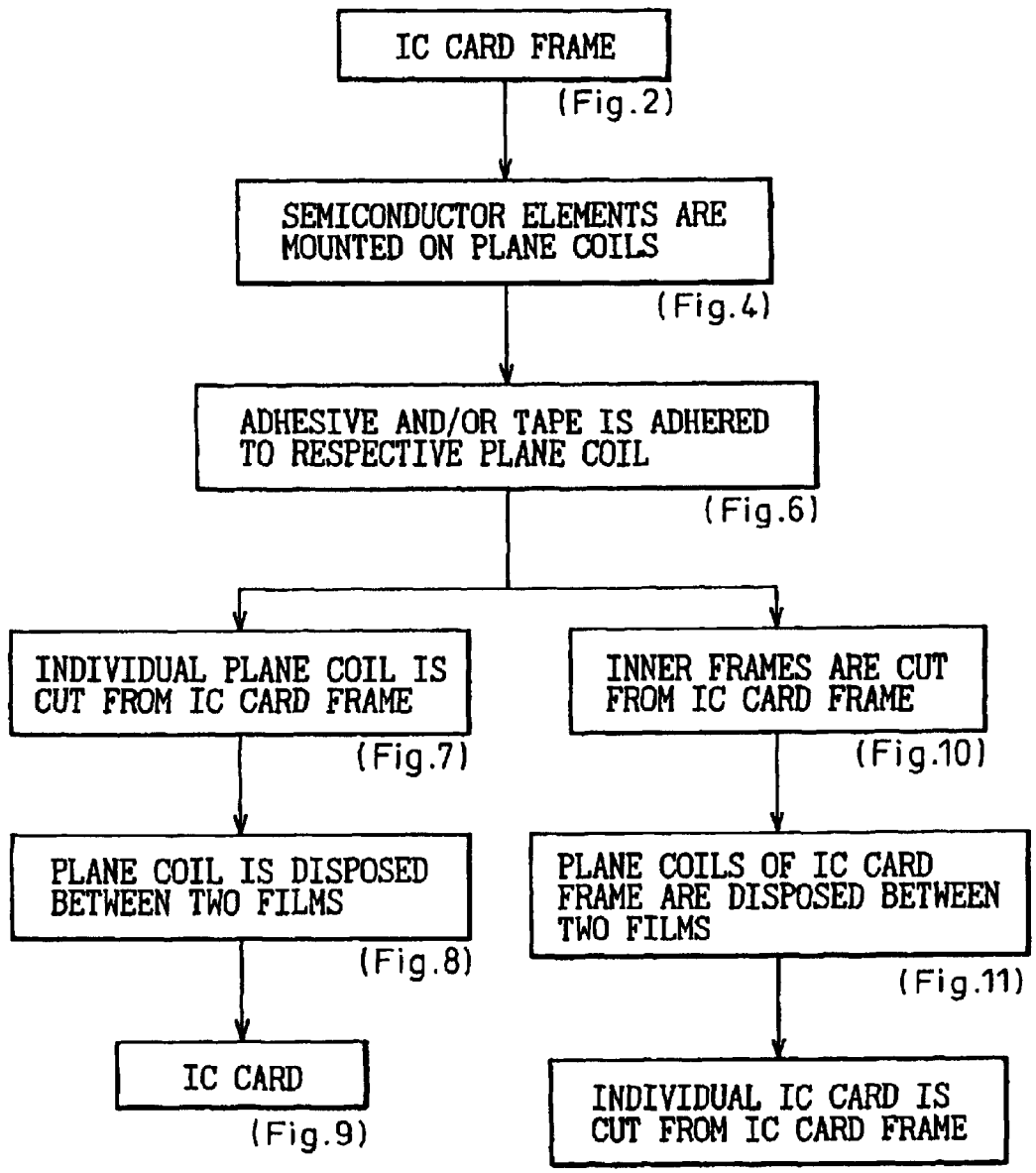

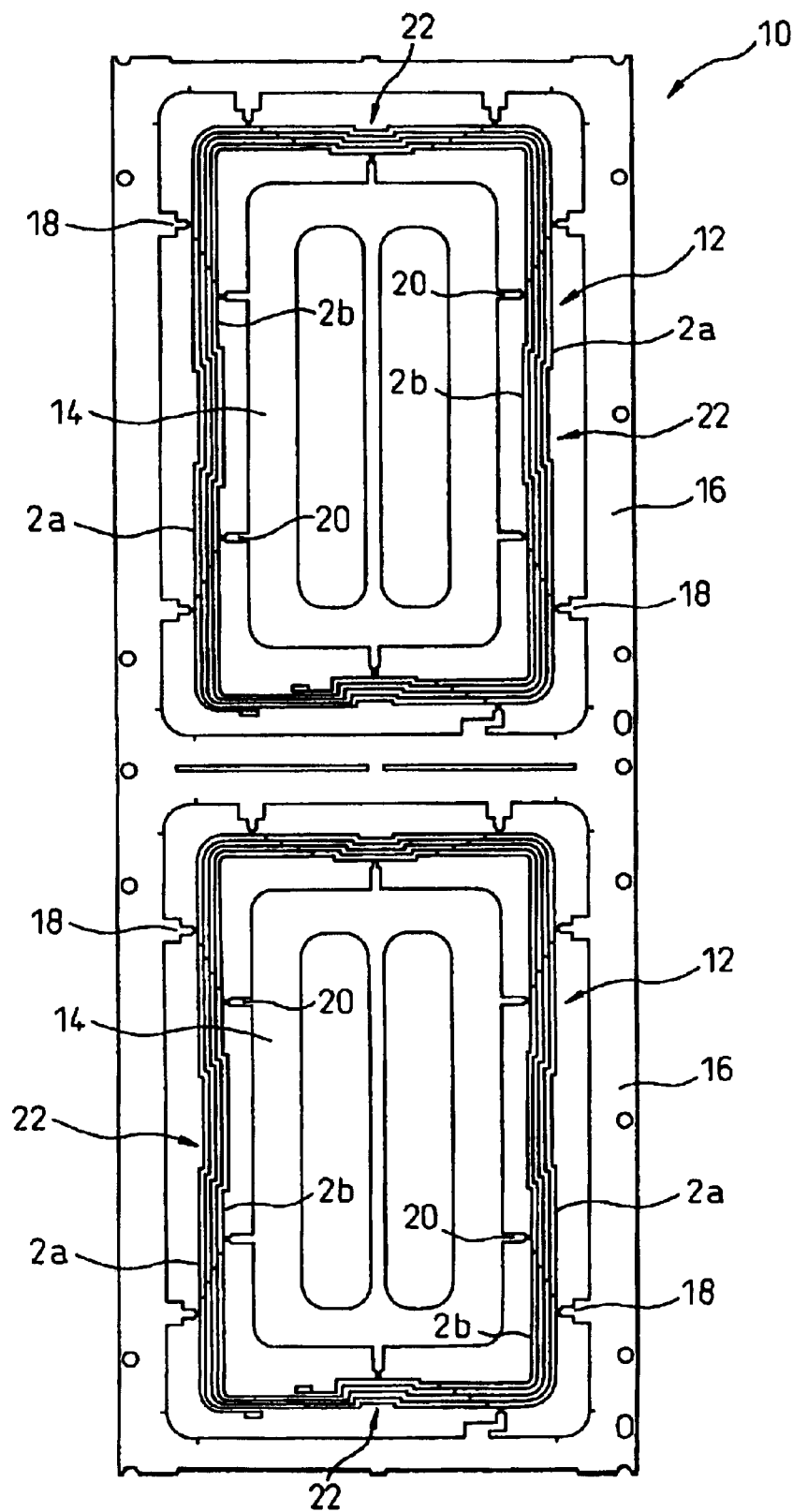

PROCESS FOR MANUFACTURING IC CARD

This application is a continuation of application Ser. No. 09/407,303, filed Sep. 29, 1999, now U.S. Pat. No. 6,630,370.

BACKGROUND OF THE INVENTION

1. Field of the Invention

The present invention relates to a process for manufacturing an IC card. More particularly, the present invention relates to a process for manufacturing an IC card having a plane coil in which a conductor line is wound a plurality of times on substantially the same plane, and terminals of the plane coil and electrode terminals of a semiconductor element are electrically connected to each other.

2. Description of the Related Art

As shown in FIG. 15, an IC card is composed of a rectangular plane coil 100, in which a conductor 102 is wound a plurality of times, and a semiconductor element 104. The above plane coil 100 and semiconductor element 104 are disposed between two sheets of resin films 106 made of PVC, on the surfaces of which characters are printed. These two sheets of resin films are bonded to each other by an adhesive layer made of polyurethane resin. The plane coil 100 and semiconductor element 104 are sealed by the adhesive layer.

When the thus formed IC card passes through a magnetic field formed in a card processor, electric power is generated by electromagnetic induction caused in the plane coil 100 of the IC card. Therefore, the semiconductor element 104 is started by electric power generated by electromagnetic induction, so that communication can be made between the semiconductor element 104 of the IC card and the card processor via the plane coil 100 which functions as an antenna.

Concerning the conventional plane coil 100 incorporated into the IC card, there is provided a conventional plane coil formed in such a manner that a covered electric wire is wound a plurality of times.

However, when the plane coil 100 is formed by winding the covered electric wire, it is difficult to reduce the manufacturing cost of the plane coil 100. Also, it is difficult to efficiently mass-produce the IC cards. As a result, it is difficult to promote the spread of the IC cards.

In order to solve the above problems, Japanese Unexamined Patent Publication No. 6-310324 discloses a method of forming a plane coil by means of punching.

As disclosed in the above patent publication, when the plane coil is formed by means of punching, it becomes possible to reduce the cost of the IC card and also it is possible to mass-produce it compared with a conventional IC card, the plane coil of which is made by winding a covered electric wire.

However, it was found that the handling property of the above plane coil formed by means of punching is very low. When no forces are given to the rectangular plane coil 100, which has been formed by punching, from the outside, predetermined intervals are formed between the conductor lines 102 adjacent to each other in the peripheral direction as shown in FIG. 16(a).

However, when external force F is given to the plane coil 100 in the traverse direction as shown in FIG. 16(b), the conductor line 102 is deformed, and short circuits occur when the adjacent conductor lines 102 come into contact with each other.

The above contact of the conductor lines 102 is caused by deformation of the conductor lines 102 themselves, as follows. In the process of manufacturing the IC card, for example, when an external force is given to the plane coil 100 for conveying and accommodating it, the conductor lines 102 are deformed. Also, when the plane coil 100 is disposed between the resin films 106, on one side of which an adhesive layer is provided, an external force generated by a flow of the adhesive is given to the conductor line 102 in the traverse direction, so that the conductor lines 102 are deformed.

Therefore, it is an object of the present invention to provide a method of manufacturing an IC card in which short circuit is seldom caused by deformation of the conductor lines generated by an external force given to the plane coil in the traverse direction when the plane coil is conveyed and accommodated in the process of manufacturing the IC card.

SUMMARY OF THE INVENTION

The present inventors made investigation to solve the above problems. As a result, they accomplished the following invention as follows. A tape member is made to adhere to a plurality of portions of the plane coil 100, so that the conductor lines 102 composing the plane coil 100 are kept in such a manner that the respective conductor lines 102 are arranged at predetermined intervals with respect to the adjacent conductor lines 102. Due to the above arrangement of the conductor lines 102, when the plane coil 100 is conveyed and accommodated, it is possible to prevent the occurrence of short circuit caused by deformation of the conductor lines 102.

According to the present invention, there is provided a process for manufacturing an IC card comprising the following steps of: forming a plane coil by etching or punching a thin metal plate so that the plane coil consists of a conductor line wound as several loops in substantially the same plane and has respective terminals; mounting a semiconductor element on the plane coil, the semiconductor element having electrodes, and attaching an adhesive agent or tape to a predetermined area of the plane coil so that adjacent conductor lines in the loops are kept a predetermined gap therebetween; and inserting the plane coil between a pair of films to cover the plane coil therebetween, at least one of the films being provided with adhesive layer on a surface facing to the other film to seal the plane coil with the semiconductor element by attaching the pair of films with respect to each other by means of the adhesive layer.

The process further comprises a following steps of: electrically connecting to the electrodes of the semiconductor element to the respective terminals of the plane coil, after the semiconductor element is mounted on the plane coil and before the plane coil is sealed by the pair of films.

The process further comprises the following steps of: forming an IC card frame by etching or punching a thin metal plate so that the IC card frame comprises at least one plane coil consisting of a conductor line wound as several loops in substantially the same plane and having respective terminals and a frame connected to and spaced by a predetermined distance from the plane coil so as to support the plane coil; and separating the plane coil from the frame.

The separating step comprises a step of: separating individual plane coil from the frame; thereafter the individual plane coil is sealed with the semiconductor element by means of the pair of films.

The plurality of individual plane coils are continuously sealed by means of the pair of films; thereafter the films are cut and separated to obtain individual IC cards.

The process further comprises the following steps of: forming an IC card frame comprising at least one plane coil, at least one inner frame portion and an outer frame portion, the inner and outer frame portions are located inside and outside of the plane coil and connected to and spaced by a predetermined distance from innermost and outermost conductor lines of the plane coil so as to support the plane coil; and separating the plane coil from the inner and outer frame portions.

The process further comprises the following steps of: separating the inner frame portion from the innermost conductor lines of the plane coil, after the adhesive agent or tape is attached to the plane coil; and separating the outer frame portion from the outermost conductor lines of the plane coil, after the plane coil is sealed with the semiconductor element by means of the pair of films.

The process further comprises following steps of: forming an IC card frame by etching or punching a thin metal strip so that the IC card frame comprises a plurality of plane coils continuously arranged in a longitudinal direction of the thin metal strip, each plane coil consisting of a conductor line wound as several loops in substantially the same plane and having respective terminals, a plurality of inner frame portions each located inside an innermost conductor line of the respective plane coil and an outer frame portion located outside outermost conductor lines of the plane coils, the inner and outer frame portions are connected to and spaced by a predetermined distance from innermost and outermost conductor lines of the plane coil so as to support the plane coils; mounting semiconductor elements on the respective plane coils, each semiconductor element having electrodes, and attaching an adhesive agent or tape to a predetermined area of the respective plane coil so that adjacent conductor lines in the loops are kept a predetermined gap therebetween; and separating the individual plane coils from the inner and outer frame portions.

The plane coil forming step comprises: forming a bent portion protruded outward or inward from conductor lines in the respective loops of the plane coil.

The plane coil forming step comprises forming connecting pieces for connecting adjacent conductor lines in the loops of the plane coil to keep a predetermined gap between the adjacent conductor lines; and removing the connecting pieces after the steps of attaching an adhesive agent or tape to the plane coil.

According to another aspect of the present invention, there is provided a process for manufacturing an IC card comprising the following steps of:

forming an IC card frame by etching or punching a thin metal strip so that the IC card frame comprises a plurality of plane coils continuously arranged in a longitudinal direction of the thin metal strip, each plane coil consisting of a conductor line wound as several loops in substantially the same plane and having respective terminals, a plurality of inner frame portions each located inside an innermost conductor line of the respective plane coil and an outer frame portion located outside outermost conductor lines of the plane coils, the inner and outer frame portions being connected to and spaced by a predetermined distance from innermost and outermost conductor lines of the plane coil so as to support the plane coils;

mounting semiconductor elements on the respective plane coils, the each semiconductor element having electrodes, and attaching an adhesive agent or tape to a predetermined area of the respective plane coil so that adjacent conductor lines in the loops are kept a predetermined gap therebetween; and separating the respective inner frame portions from the respective innermost conductor lines of the respective plane coils of the IC card frame, and thereafter inserting the IC card frame between a pair of films to cover the respective plane coils therebetween, at least one of the films being provided with adhesive layer on a surface facing to the other film to seal the plane coils with the semiconductor element by attaching the pair of films with respect to each other by means of the adhesive layer; and separating the outer frame portion from the respective outermost conductor lines of the respective plane coils to obtain an individual IC card.

According to the present invention as mentioned above, when an adhesive member and/or tape member is made to adhere to a predetermined portion of the plane coil formed by the etching or punching of a metallic sheet, it is possible to maintain the state of the conductor lines of the plane coil which are wound at predetermined intervals with respect to the adjacent conductor lines. Due to the above arrangement, when the plane coil is conveyed, even if an external force is given to each conductor line in the traverse direction, the conductor line is seldom deformed. Therefore, it is possible to prevent the occurrence of short circuit caused by the contact of the conductor lines with each other.

In order to prevent the deformation of conductor lines caused by conveyance until the adhesive member and/or tape member is made to adhere to a predetermined portion of the plane coil, it is preferable to form a frame for an IC card, to which the plane coil is partially connected, in the frame formed while a predetermined interval is left between the frame and the plane coil, wherein the frame for an IC card is formed by etching or punching a metal sheet.

When the respective conductor lines, which are adjacent to each other in the inside and the outside direction, are connected with each other by connecting pieces, the respective conductor lines, on the circumference composing the plane coil, can be integrated into one body. Therefore, deformation of the conductor lines can be further prevented.

BRIEF DESCRIPTION OF THE DRAWINGS

FIG. 1 is a process drawing showing an outline of a method of manufacturing an IC card of the present invention;

FIG. 2 is a plan view showing an embodiment of an IC card frame used in the present invention;

DETAILED DESCRIPTION OF THE PREFERRED EMBODIMENTS

Figure 3A:
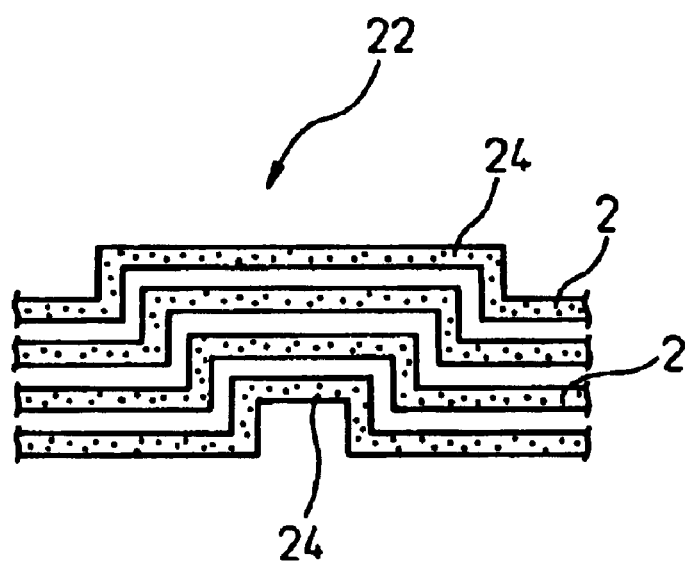
FIGS. 3(a) and 3(b) are partially enlarged plan views for explaining a bent portion of the plane coil shown in FIG. 2.

Some embodiments of the process for manufacturing an IC card of the present invention will be explained below by referring to the appended drawings.

FIG. 1 is a flow chart showing an embodiment of the process for manufacturing the IC card of the present invention. FIG. 2 is a view showing an embodiment of the IC card frame used in this flow chart. The frame 10 for the IC card shown in FIG. 2 is formed by etching or press-forming a metal sheet. There are provided an inside frame 14 and an outside frame 16 which are respectively formed inside and outside with a predetermined interval provided between them. The respective plane coils 12, 12 are partially connected to the inside frame 14 and the outside frame 16. The specific structure of the connection is described as follows. Support portions 18, 18 . . . extending from a plurality of positions of the inner edge of the outside frame 16 are connected to the outermost conductor 2a of the plane coil 12. At the same time, support portions 20, 20 . . . extending from a plurality of positions of the outer edge of the inside frame 16 are connected to the innermost conductor 2b of the plane coil 12.

When the plane coil 12 and the frame, which is formed with a predetermined interval provided between the outside and the inside frame, are partially connected to each other so that the plane coil 12 can b supported by the frame, the handling property of the plane coil 12 can be enhanced when it is conveyed and accommodated.

Examples of the metal sheets to be etched or press-formed are metal sheets made of copper, iron, aluminum and alloys of them. Especially when a metal sheet made of iron or aluminum is used, it is possible to reduce the manufacturing cost of the plane coil. In this connection, a metal sheet wound like a coil may be drawn out, so that it can be used as a metal sheet.

The plane coil 12 formed in the frame 10 used for the IC card shown in FIG. 2 is rectangular, and bent portions 22, 22 . . . are formed in the straight line portions of the plane coil 12. As shown in FIG. 3(a), this bent portion 22 is formed in such a manner that a bent portion 24 protruding to the inside of the plane coil 12 is formed at the substantially same position of each conductor 2 composing the straight line portion of the plane coil 12. Since the bent portions 22 are formed in the plane coil 12, the rigidity can be enhanced. Due to the above structure, even if an external force is given to the plane coil 12 in the traverse direction when it is conveyed, deformation of the conductors 2 composing the plane coil 12 can be prevented. Therefore, the occurrence of short circuit caused by contact of the conductors with each other can be prevented.

Further, when the plane coil 12 is formed by punching a metal sheet, a punching clearance between the conductors composing the plane coil 12 becomes long and slender. Therefore, the rigidity of the punch is decreased. Due to the foregoing, there is a possibility that the punch is broken in the punching process and further the formed conductors are twisted. In order to solve such problems, when the bent portion 24 is formed in the conductor 2 on each circumference, a bent portion is also formed in the punch according to the configuration of the bent portion of the conductor 2. Due to the foregoing, the rigidity of the punch can be enhanced. Accordingly, it is possible to prevent the punch from being damaged in the punching process, and also it is possible to prevent the occurrence of twist of the conductor 2.

Figure 3B:
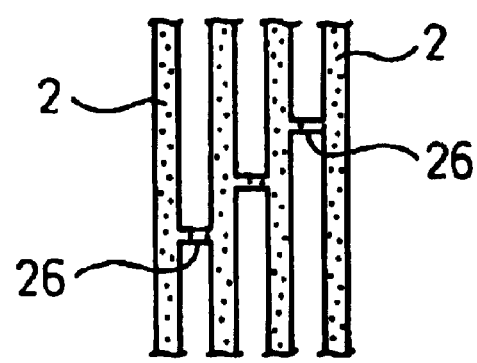

As shown in FIG. 3(b), in the plane coil 12 shown in FIG. 2, there are provided a plurality of connecting pieces 26 for connecting the conductor lines 2 which are adjacent to each other in the inward and the outward direction of the plane coil 12. By the above connecting pieces 26, 26, . . . the conductors 2 can be integrated into one body. Therefore, the conductors 2 are not collapsed. Due to the foregoing, when a plurality of frames 10 used for IC cards are laminated and conveyed or accommodated, the conductors 2 of the laminated plane coils are not entangled with each other. Therefore, deformation of the conductors 2 can be prevented.

When the above connecting pieces 26, 26 . . . are formed stepwise between the conductors 2 as shown in FIG. 3(b), the connecting pieces 26, 26 . . . can be easily cut off by a punch for cutting as described later, and further it is possible to enhance the mechanical strength of the punch for cutting. That is, the connecting pieces 26, 26 . . . are usually cut off all at once. Therefore, when the connecting pieces 26, 26 . . . are formed in a straight line, the punch used for cutting becomes comb-shaped, and it becomes difficult to machine the punch used for cutting, and further the mechanical strength of the punch is decreased. From this viewpoint, when the connecting pieces 26, 26 . . . are formed stepwise as shown in FIG. 3(b), a position at which each punch for cutting is formed can be shifted according to the position at which each connecting piece 26 is formed. Accordingly, the punch for cutting can be easily machined, and the mechanical strength of the punch for cutting can be enhanced.

In this connection, the connecting pieces 26, 26 . . . are cut off until a sealing process described later is conducted in which the plane coil 12 is sealed so that a predetermined interval can be formed between the wound conductors 2.

Figure 4:
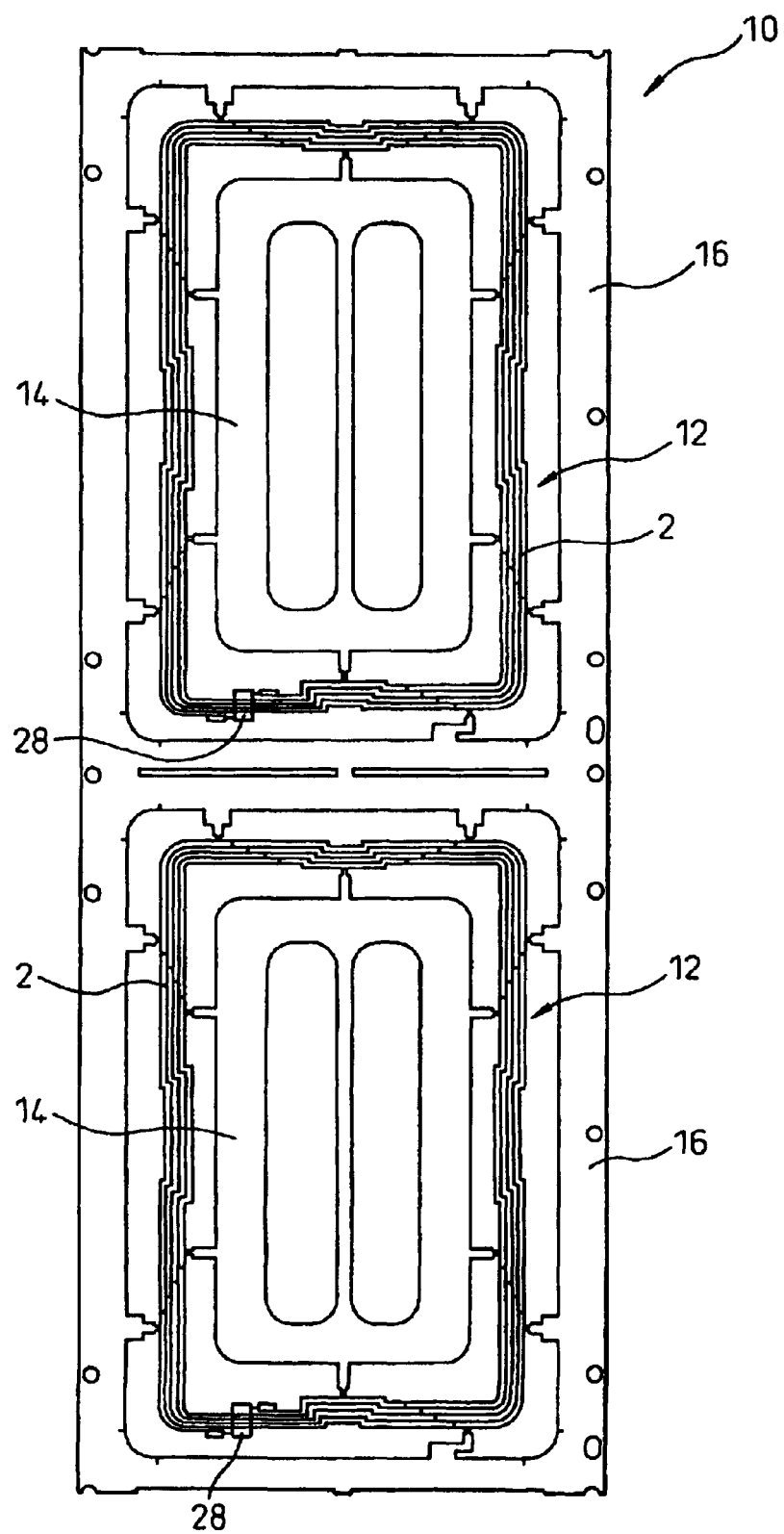
FIG. 4 is a plan view of a frame for an IC card showing a state in which a semiconductor element is incorporated into the plane coil shown in FIG. 2.
Figure 5A:
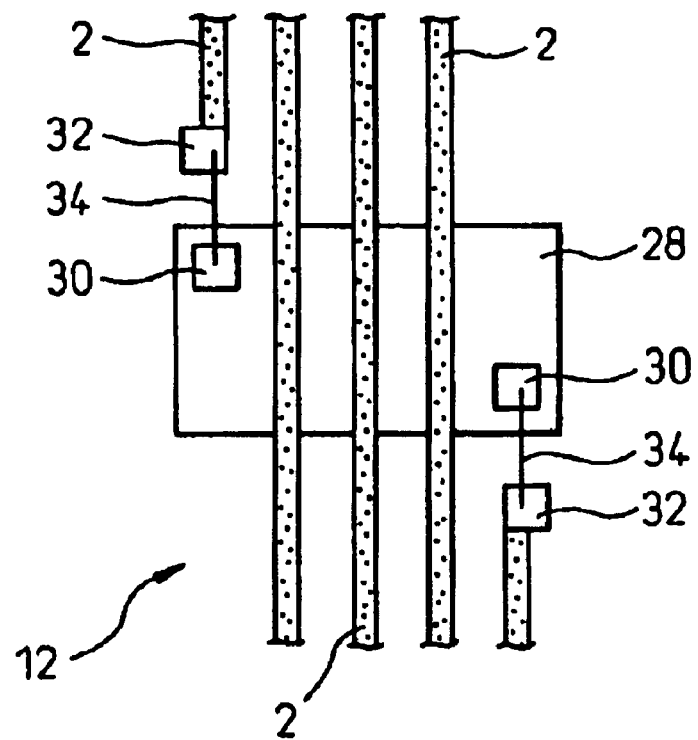
FIG. 5(a) is a partially enlarged plan view for explaining a portion of the plane coil shown in FIG. 4 into which a semiconductor element is incorporated.
Figure 5B:
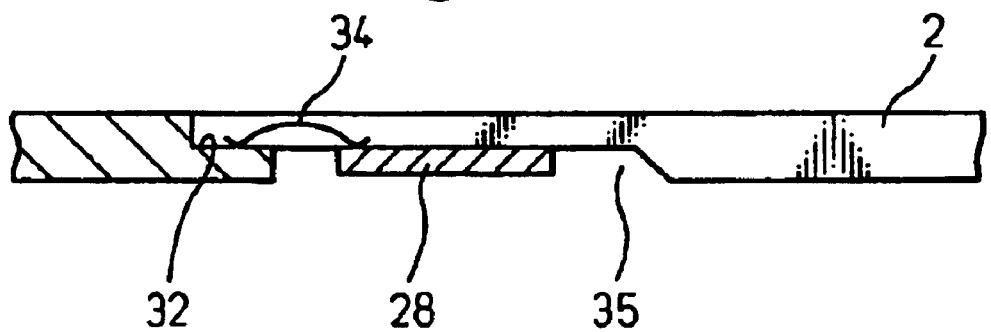
FIG. 5(b) is a partially enlarged cross-sectional view for explaining a portion of the plane coil shown in FIG. 4 into which a semiconductor element is incorporated.

As shown in FIG. 1, a semiconductor element is mounted on the plane coil 12 of the frame 10 for the IC card shown in FIGS. 2 and 3. The plane coil 12 on which the semiconductor element is mounted is shown in FIG. 4. As shown in FIG. 5(a), the semiconductor element 28 is mounted at a position close to terminals 32, 32 of the plane coil 12. In a portion close to the terminals 32, 32 of the plane coil 12, an interval between the conductors 2 adjacent to each other is smaller than that of other portions as shown in FIG. 4. In the conductor 2 on each circumference, the clearance of which is smaller than that of other portions, there is provided a recess 35, which is directed downward, as shown in FIG. 5(b).

The semiconductor element 28 is mounted so that a face on which the electrode terminal 30 of the semiconductor element 28 is formed can be directed onto the bottom surface side of the recess 35. As shown in FIG. 5(a), the electrode terminals 30, 30 of the semiconductor element 28 are connected to the terminals 32, 32 of the plane coil 12 by wires 34, 34.

The terminal 32 of the plane coil 12 connected to the semiconductor element 28 by the wire 34 is subjected to squeezing, so that the terminal area can be extended, and at the same time an end face of the terminal is made to be lower than the conductor 2. Due to the above structure, the mounted semiconductor element 28 is not protruded from a face of the plane coil 12 and, when wire bonding is conducted by the wedge bonding method, loops of the wires 34, 34 do not protrude from the face of the plane coil 12.

Figure 6:
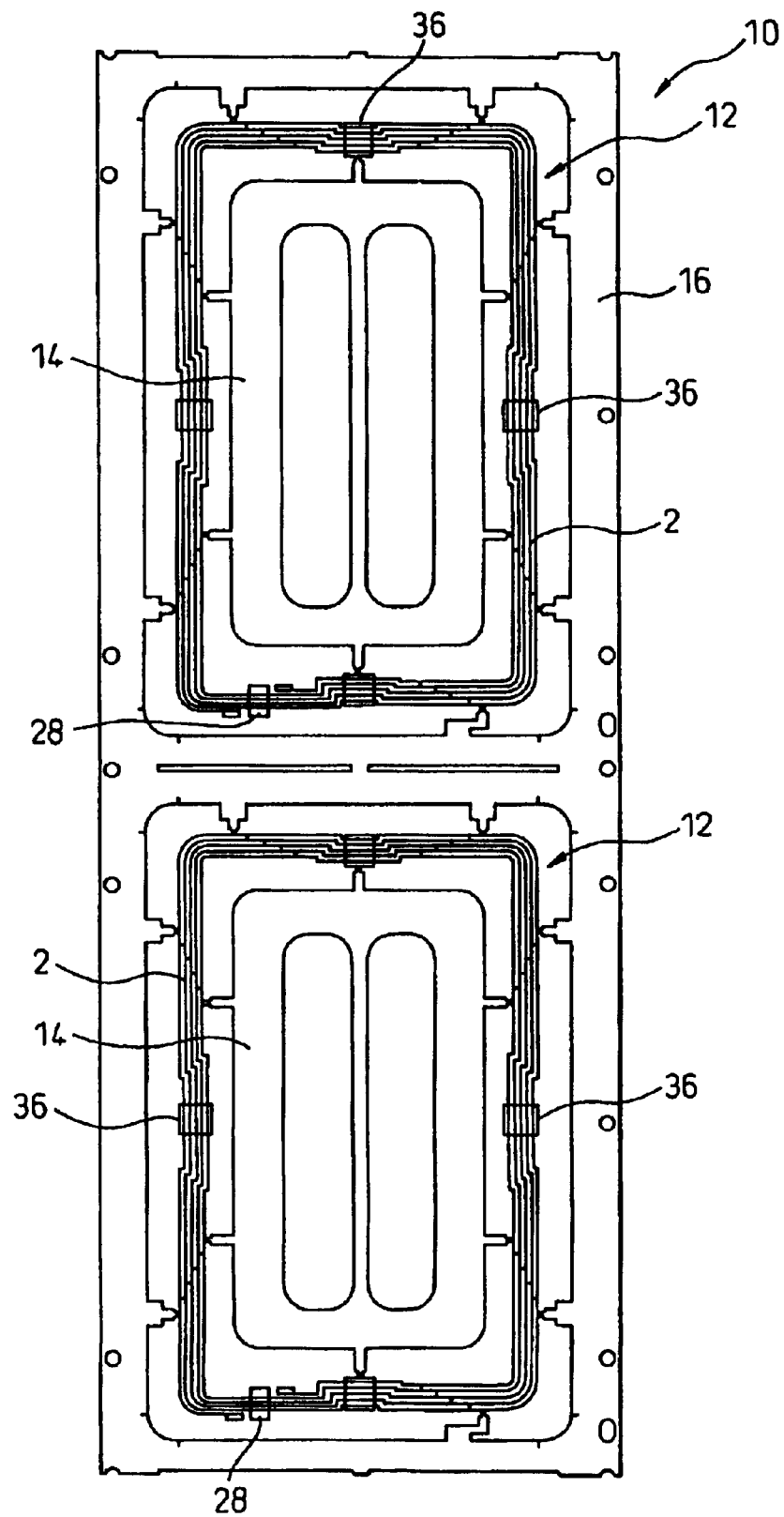
FIG. 6 is a plan view of a frame of an IC card showing a state in which a tape member is made to adhere to the plane coil shown in FIG. 4.

As shown in FIGS. 4 and 5, after the semiconductor element 28 has been mounted at a predetermined position of the plane coil 12 of the frame 10 for the IC card, an adhesive member and/or a tape member is bonded to the plane coil 12 as shown in FIG. 1. FIG. 6 is a view showing a state in which the tape member is bonded to the plane coil 12. The tape members 36 are bonded to a plurality of positions of the plane coil 12 shown in FIG. 6. This tape member 36 is composed in such a manner that an adhesive layer is formed on one side of the tape member. In a portion to which this tape member is bonded, adhesive which has entered a space between the wound conductors is solidified, so that the conductors 2 can be fixed while a predetermined interval can be provided between them.

In the rectangular plane coil 12 shown in FIG. 6, when the tape member 36 is bonded to each straight line portion of the plane coil 12, each conductor 2 composing the plane coil 12 can be fixed while a predetermined interval can be provided. Therefore, it is possible to cut off the connecting pieces 26, 26 . . . for connecting the conductors of the plane coil 12, and it is also possible to separate the plane coil 12 as shown in FIG. 1. This separation of the plane coil 12 is defined as follows. The plane coil 12 is separated from the inner frame 14 and the outer frame 16 of the frame 10 for the IC card.

As the tape member 36 for fixing the conductors 2 of the plane coil 12, a hot melt sheet can also be used in place of the individual tape members 36 such as shown in FIG. 6. The hot melt sheet includes a hot melt adhesive provided on an exfoliation tape. The hot melt sheet is brought to be adhered to the plane coil 12 over the all area thereof from one side or respective sides thereof. Thereafter the connecting pieces 26, 26 . . . of the plane coil 12 are cut off. The exfoliation tape of the hot melt sheet can be removed after the connecting pieces 26, 26 . . . are cut off.

Otherwise, such a hot melt sheet may preferably be provided with openings at positions corresponding to the connecting pieces 26, 26 . . . The reason is that, since the connecting pieces 26, 26 . . . are cut off by punching process after the exfoliation tape is removed from the hot melt sheet, it is necessary to prevent the hot melt adhesive from being adhered to the punch, when the punching operation is conducted from a side of the plane coil 12 to which the hot melt sheet is adhered.

Figure 7:
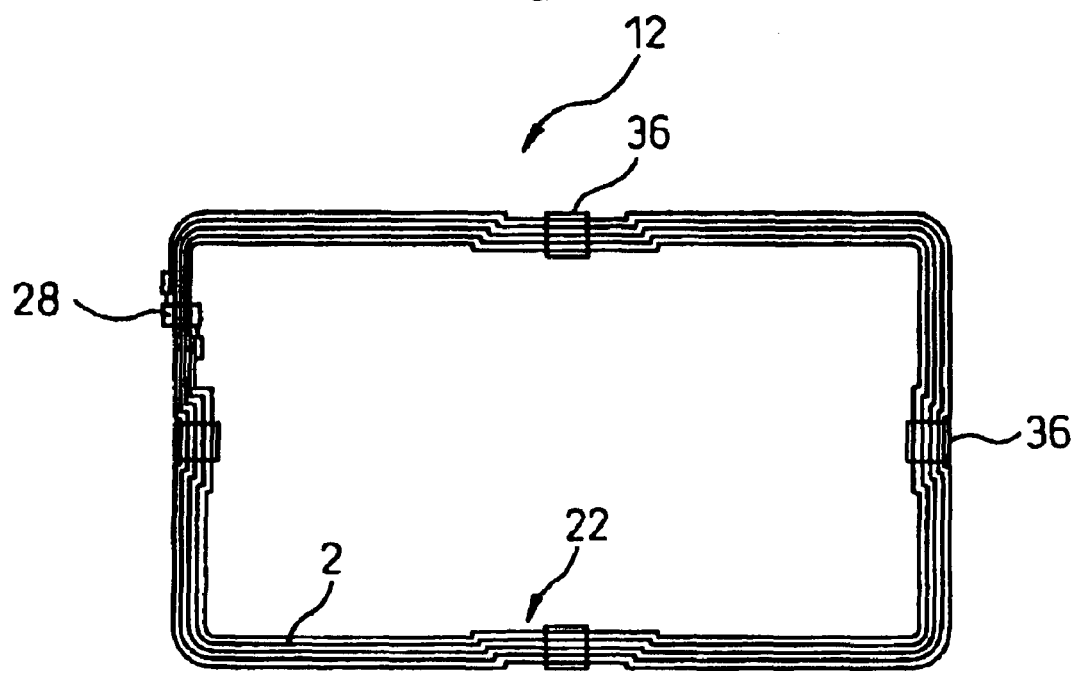
FIG. 7 is a plan view showing a plane coil separated from the frame for an IC card shown in FIG. 6.

As shown in FIG. 7, in the separated plane coil 12, each conductor 2 is fixed by the tape member 36. Therefore, even if an external force is given to the plane coil 12 in the traverse direction, each conductor 2 is not deformed. Accordingly, the occurrence of a short circuit caused by contact between the conductors can be prevented.

In this case, the tape member 36 is bonded to each straight line portion of the rectangular plane coil 12. However, the tape member 36 may be bonded to each corner portion of the plane coil 12, and also the tape member 36 may be bonded to both the straight line portion and the corner portion of the plane coil 12. Instead of the tape member 36, it is possible to use adhesive, and both the tape member 36 and the adhesive may be used together.

In this connection, the connecting portion 26, 26 . . . may be cut off after the plane coil 12 has been separated from the IC card frame 10.

As described above, the plane coil 12 shown in FIG. 7 is separated from the IC card frame 10, and the tape members 36, 36 are bonded to the plane coil 12 and, further, the semiconductor element 28 is mounted on the plane coil 12. As shown in FIG. 1, this plane coil 12 is disposed between two sheets of films and sealed by resin.

Figure 8:
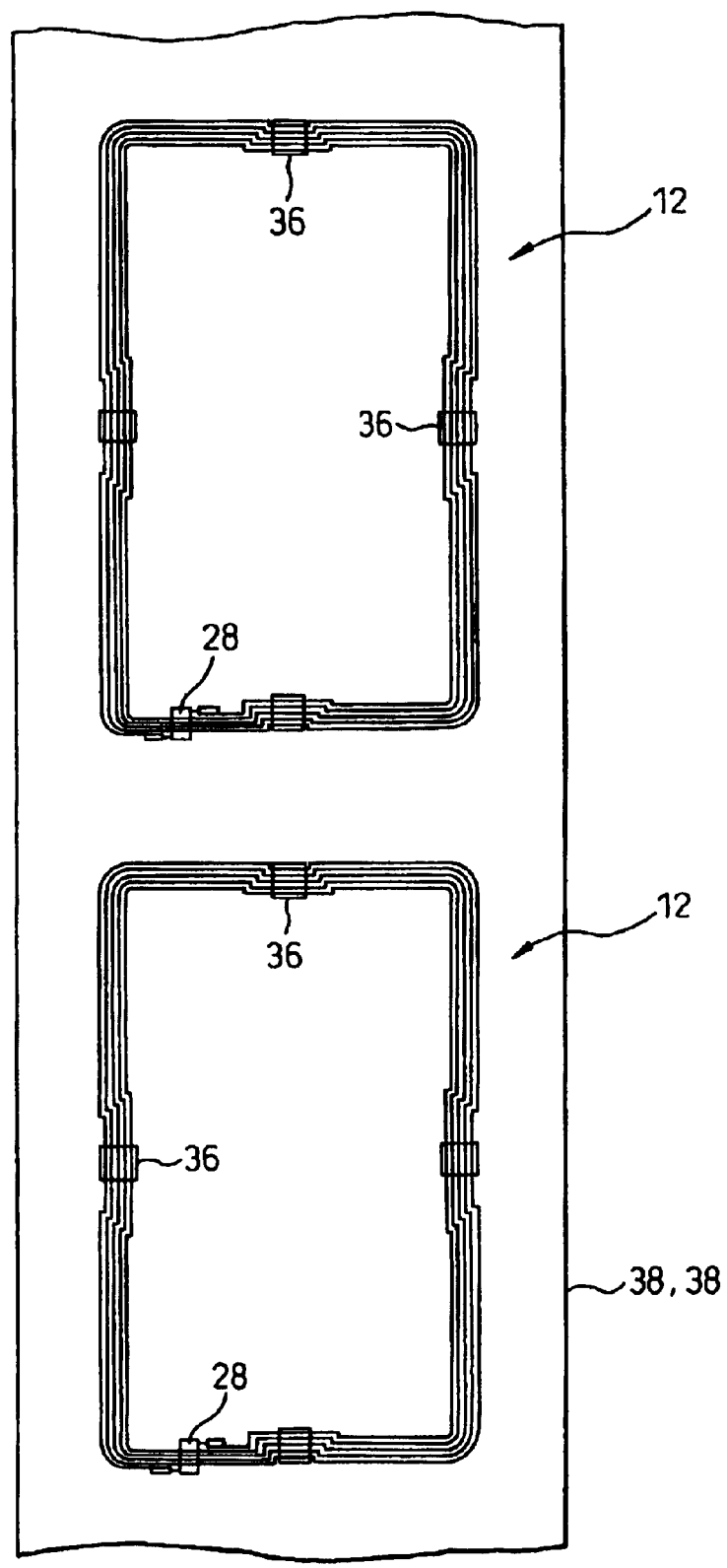
FIG. 8 is a plan view showing a state in which the plane coil shown in FIG. 7 is disposed between two sheets of films.

The plane coil 12 is sealed by resin as follows. As shown in FIG. 8, the tape members 36, 36, which have been separated from the frame 10 for the IC card, are bonded between two sheets of films 38, 38 made of ABS resin or PET (polyethylene terephthalate) resin, at least on one of the opposing faces of which an adhesive layer is provided. When a plurality of plane coils 12, 12 on which the semiconductor elements 28 are mounted are disposed between two sheets of films, the two sheets of films 38, 38 are bonded to each other by the adhesive layer, and at the same time the plurality of plane coils 12, 12 on which the semiconductor elements 28 are mounted can be sealed by resin.

In the above sealing process, each conductor 2 of the plane coil 12 is given a force in the traverse direction by a flow of adhesive. However, each conductor 2 on the circumference is fixed by the tape member 36. Therefore, each conductor 2 on the circumference is not deformed.

Figure 9:
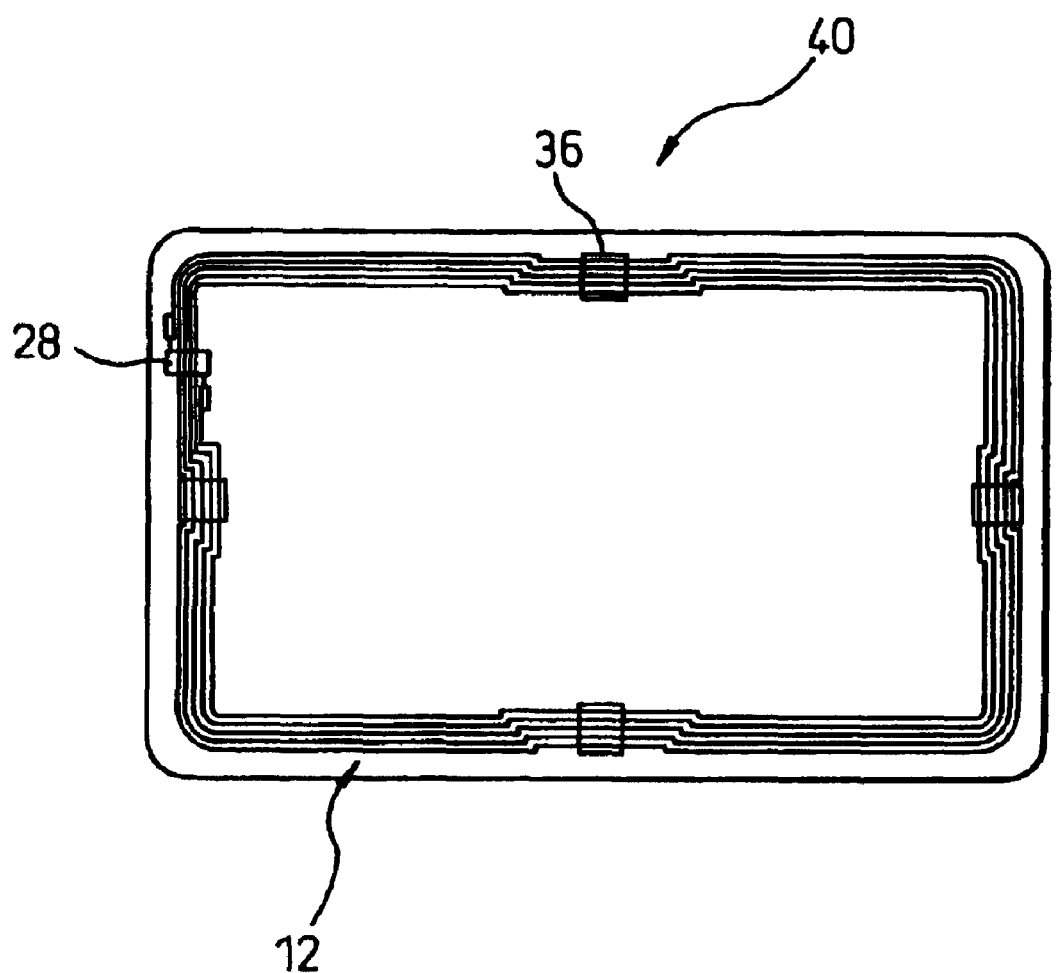
FIG. 9 is a plan view showing a finally obtained IC card.

The plurality of plane coils 12, 12 disposed between the two sheets of belt-shaped films 38, 38 are made into IC cards as shown in FIG. 1. In the process of making the plurality of plane coils 12, 12 into IC cards, the films 38, 38 joined by the adhesive layer are cut off at predetermined positions so that they can be made into individual bodies. In this way, the IC card shown in FIG. 9 can be obtained.

In this connection, faces of the two films 38, 38, which are opposite to the opposing faces, become surfaces of the finally obtained IC card. Therefore, various printing can be conducted on the faces.

The method of manufacturing the IC card, in which the plane coil 12, to which the tape members 36, 36 are bonded and the semiconductor element 28 is mounted, is separated from the frame 10 for the IC card and disposed between the two films is explained above. However, it is possible to adopt a method of manufacturing the IC card without separating the plane coil 12 from the frame 10 for the IC card. When the IC card is manufactured without separating the plane coil 12 from the frame 10 for the IC card, it is possible to reduce the number of processes in which the plane coil 12 separated from the frame 10 for the IC card is individually handled. Accordingly, the handling property of the plane coil 12 can be enhanced, and the IC card can be easily manufactured.

In the above method of manufacturing the IC card, as shown in FIG. 1, an adhesive member and/or a tape member is bonded to the plane coil of the frame for the IC card, and then a semiconductor element is mounted on the plane coil. After that, the inner frame is cut off. In the process of cutting off the inner frame, in the inner frame 14 and the outer frame 16 composing the frame 10 for the IC card shown in FIG. 6, the inner frame 14 is cut off, that is, in the inner frame 14 and the outer frame 16 which are partially connected to the inside and the outside of the plane coil 12 to which the tape member is bonded and on which the semiconductor element 28 is mounted, the inner frame 14 is cut off.

Figure 10:
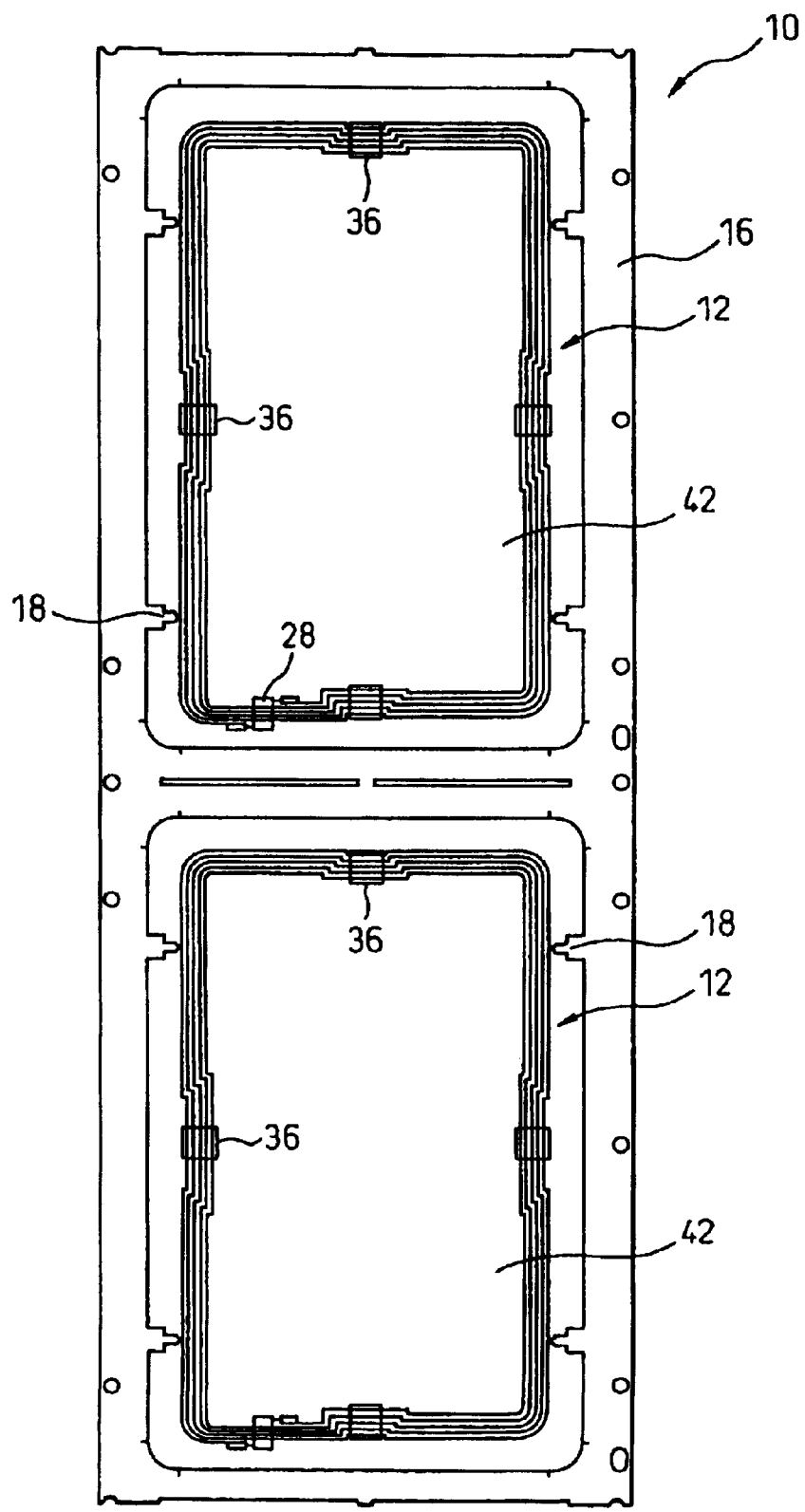
FIG. 10 is a plan view showing a state in which an inside frame is separated from the IC card frame shown in FIG. 6.

FIG. 10 is a view showing a frame 10 for the IC card in which the inner frame 14 is cut off. In the frame 10 for the IC card shown in FIG. 10, the plane coil 12 to which the tape member 36 is bonded and on which the semiconductor element 28 is mounted is supported by the support portions 18, 18 extended from the outer frame 16 under the condition that a large space 42 is formed inside the plane coil 12.

At this time, the connecting pieces 26, 26 . . . for connecting the conductors of the plane coil 12 are cut off. The connecting pieces 26, 26 . . . may be cut off simultaneously when the inner coil 12 is cut off or before or after the inner coil 12 is cut off.

In this connection, when the frame 10 for the IC card, in which the large space 42 is formed inside the plane coil 12 as shown in FIG. 10, is conveyed to the punching process, other frame 10 for the IC card may enter the space 42, or a metallic die for punching may be caught at the space 42. Accordingly, there is a possibility that the handling property of the frame 10 for the IC card is a little lowered.

Therefore, when the plane coil 12 of the frame 10 for the IC card is disposed between two sheets of films as shown in FIG. 1, it is possible to cover the space 42 with the two sheets of films. As a result, the handling property of the frame 10 for the IC card can be enhanced.

Figure 11:
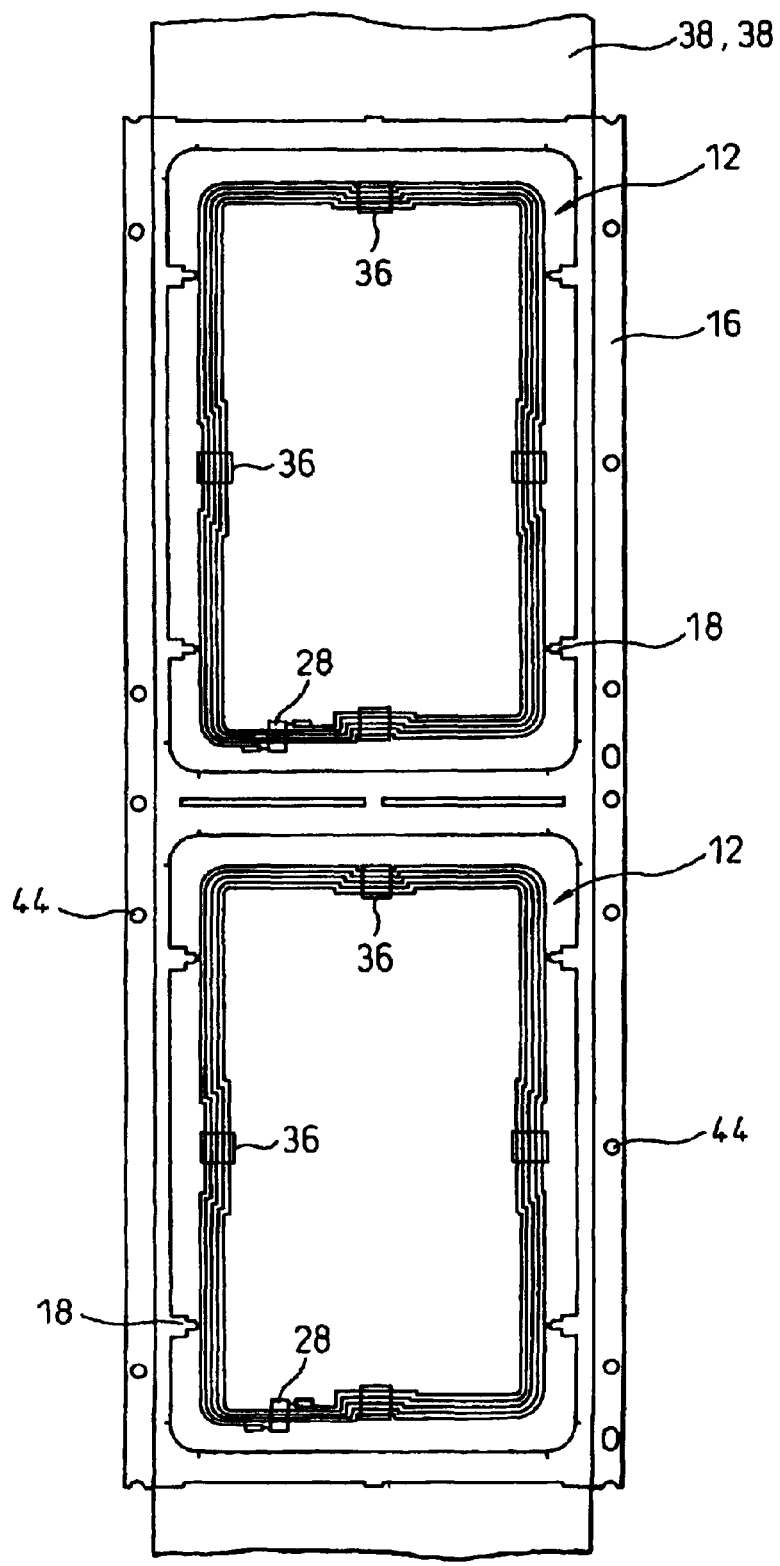
FIG. 11 is a plan view showing a state in which the frame for an IC card shown in FIG. 10 is disposed between two sheets of films.

The plane coil 12 of the frame 10 for the IC card disposed between the two sheets of films is shown in FIG. 11.

Two sheets of films 38, 38 shown in FIG. 11 are belt-shaped films 38, 38 made of resin such as ABS resin. The plane coils 12, 12 on which the semiconductor elements 28 are mounted and a portion of the outer frame 16 are disposed between the two sheets of films 38, 38. An adhesive layer is provided on at least one of the opposing faces of the two films 38, 38 which are opposed to each other. The two sheets of films 38, 38 are joined to each other by this adhesive layer and, at the same time, the plane coils 12, 12 on which the semiconductor elements 28 are mounted are sealed by the adhesive layer.

Next, the thus joined two sheets of films 38, 38 are cut off at a predetermined position. At the same time, support portions 18 extending from a plurality of positions of the inner edge of the outer frame 16 are cut off. In this way, the plane coils 12, 12 on which the semiconductor elements 28 are mounted are individualized. In this way, the IC card 40 shown in FIG. 9 can be provided.

It is preferable to determine the width of this film 38 so that the film 38 can sufficiently cover an overall face of the plane coil 12 and so that the film 38 can not close positioning holes 44, 44 . . . formed in the outer frame 16. The reason why the film 38 can not close positioning holes 44, 44 . . . formed in the outer frame 16 is that the positioning holes 44, 44 . . . are necessary when the outer frame 16 is cut off.

In this connection, the faces of the two films 38, 38, which are opposite to the opposing faces, become surfaces of the finally obtained IC card. Therefore, various printing can be conducted on the faces.

In FIGS. 7 and 11, the connecting pieces 26 are removed from the plane coil 12 disposed between the two sheets of films 38, 38. However, after the plane coil 12 has been disposed between the two sheets of films 38, 38, the connecting pieces 26 may be removed from the plane coil 12. However, holes are formed on the films 38, 38 at positions from which the connecting pieces 26 were removed. Accordingly, it is preferable that decoration films (not shown) are joined onto the films 38, 38.

Figure 12A:
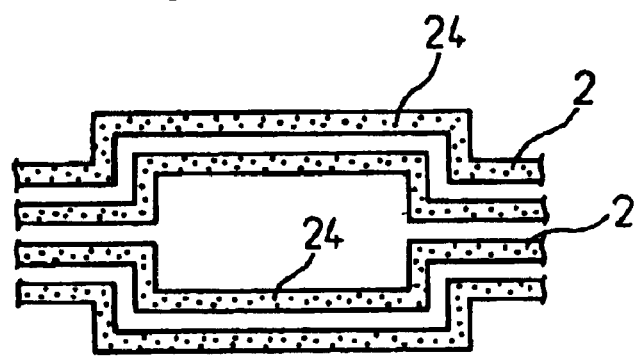
FIGS. 12(a) and 12(b) are partially enlarged plan views for explaining another embodiment of a bent portion formed in the plane coil.
Figure 12B:
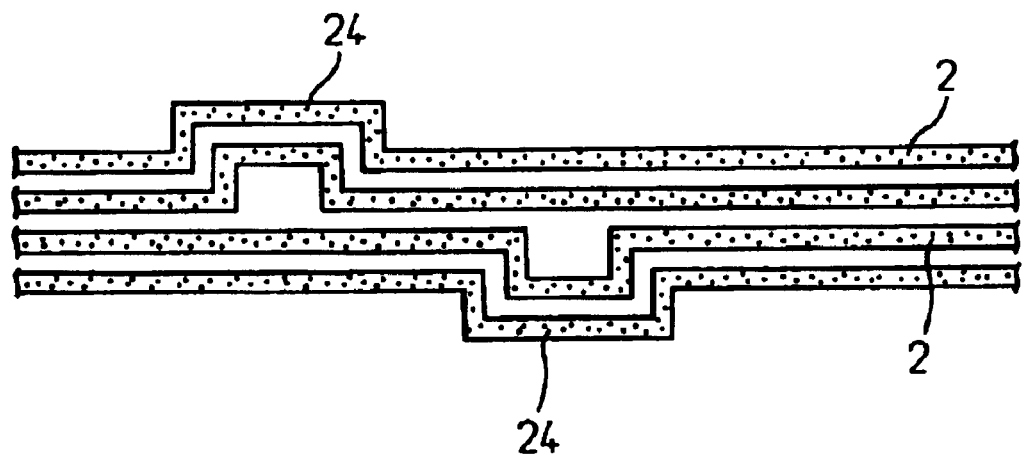

The bent portion 22 of the plane coil 12 shown in FIGS. 1 to 11 is formed into a bent portion 24 in which the conductors 2 wound on the circumference are protruded in the same direction at the substantially same position as shown in FIG. 3(a). However, the conductors 2 may be bent in such a manner that the bending directions of the conductors 2 in the bent portions 24, 24 . . . are opposite to each other as shown in FIGS. 12(a) and 12(b). Further, positions at which the bent portions 24, 24 . . . are formed may be different from each other as shown in FIG. 12(b).

In the plane coil 12 described above, one bent portion 22 is formed in one straight line portion. However, a plurality of bent portions 22 may be formed in one straight line portion, that is, a plurality of bent portions 24 may be formed in the conductor lines 2 composing one straight line portion.

Figure 13A:
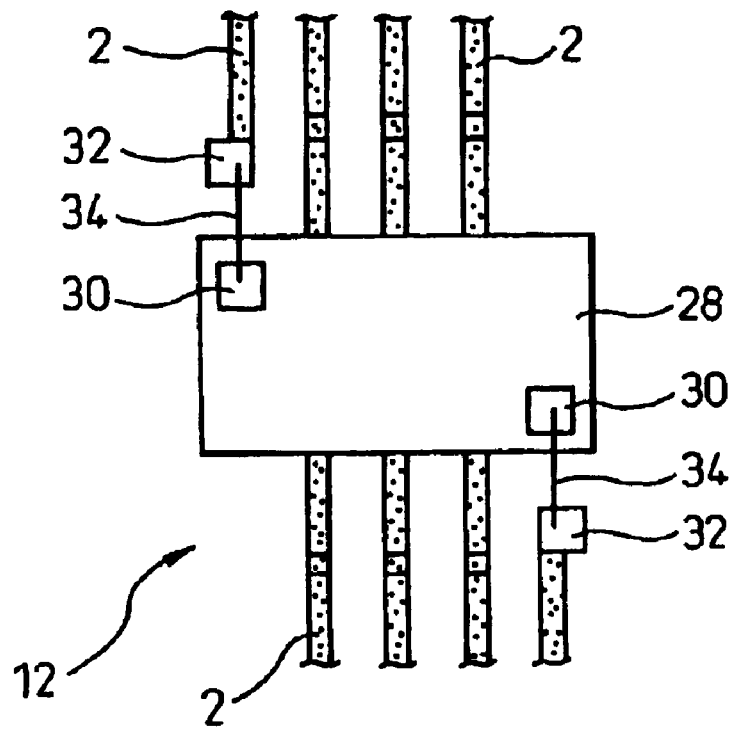
FIG. 13(a) is a partially enlarged plan view for explaining another embodiment of a portion of the plane coil into which a semiconductor element is incorporated.

As shown in FIG. 13(a), the plane coil 12 may be mounted on the face opposite to the face on which the electrode terminals 30, 30 of the semiconductor element 28 are provided, so that the conductors 2 of the plane coil 12 can pass on the face. In this case, as shown in FIG. 13(b), a recess 35 directed upward is formed in a portion of each conductor 2 on which the semiconductor element 28 is mounted, and the semiconductor element 28 is mounted on the bottom face side of the recess 35.

Figure 13B:
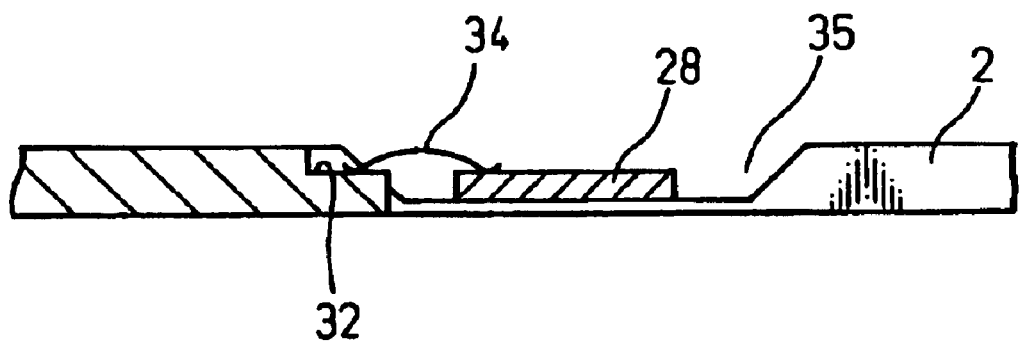
FIG. 13(b) is a partially enlarged cross-sectional view for explaining another embodiment of a portion of the plane coil into which a semiconductor element is incorporated.
Figure 14:
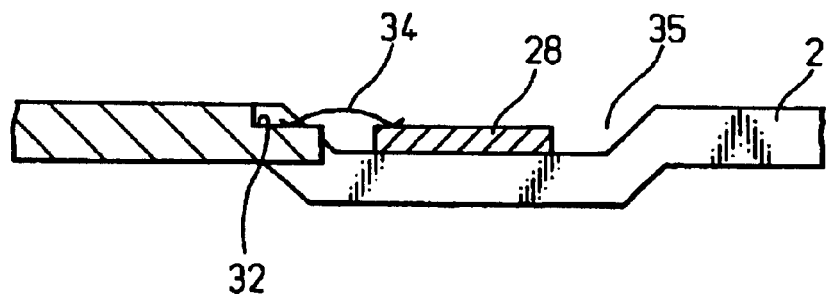
FIG. 14 is a partially enlarged cross-sectional view for explaining another embodiment of a portion of the plane coil into which a semiconductor element is incorporated.
Figure 15:
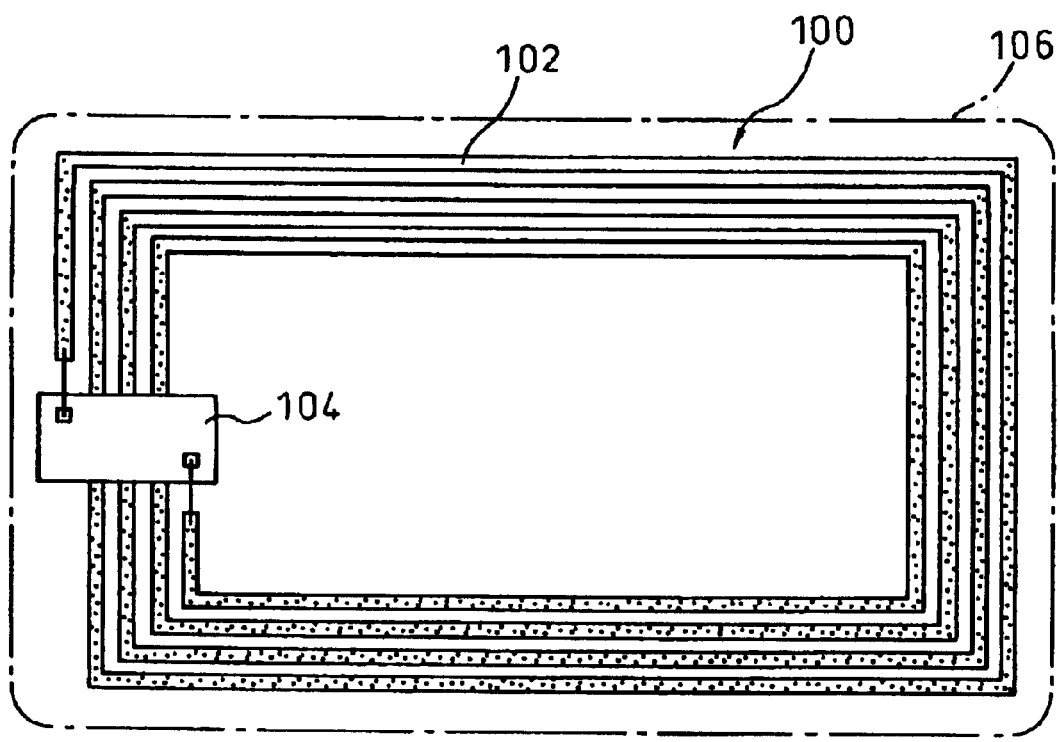
FIG. 15 is a plan view for explaining a conventional IC card.
Figure 16A:
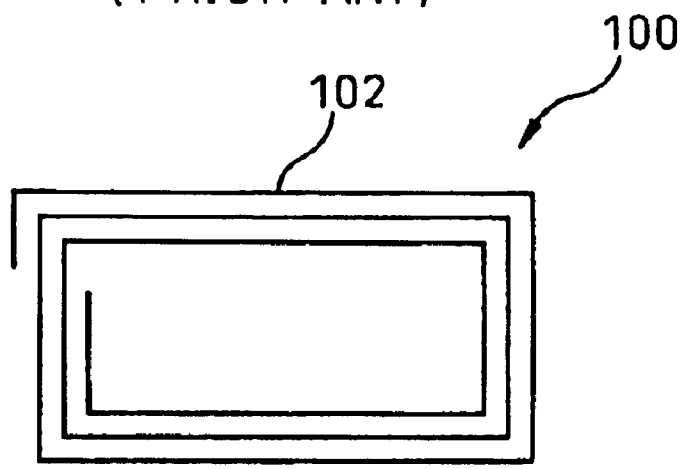
FIGS. 16(a) and 16(b) are schematic illustrations for explaining a state in which an external force is given to a conductor line composing a conventional plane coil in the traverse direction.
Figure 16B:
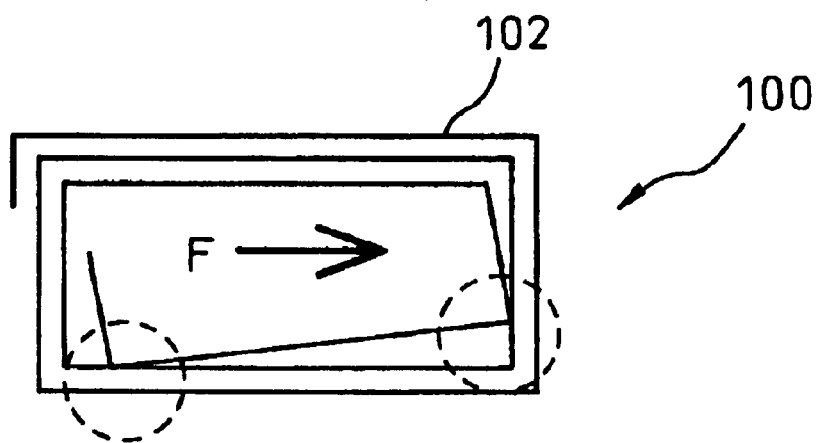

When the recess 35 is formed in each conductor 2 wound on the circumference as shown in FIG. 13(b), there is a possibility that a portion of the conductor 2 forming the bottom portion becomes too thin. In this case, the recess 35 may be formed in such a manner that a portion of the conductor 2 is bent as shown in FIG. 14.

The frame 10 for the IC card described above is a belt-shaped frame for the IC card in which a plurality of plane coils 12, 12 are formed, however, it is possible to use a frame for the IC card in which only one plane coil 12 is formed. In this case, concerning the two sheets of films 38, 38, it is necessary to use sheets of films suitable for the frame for the IC card in which one plane coil 14 is formed.

Instead of an arrangement in which the plane coil 12, on which the semiconductor element 28 is mounted, is disposed between the two sheets of films 38, 38 and the plane coil 12 is sealed by the adhesive layer formed on one side of the opposing faces, it is possible to adopt an arrangement in which the plane coil 12, on which the semiconductor element 28 is mounted, is disposed between sheets of prepreg, and then films made of resin such as ABS resin are stuck on surfaces of the sheets of prepreg and heated so that the plane coil 12 can be sealed.

In this connection, in the explanations of FIGS. 1 to 14, after the adhesive member and/or the tape member has been bonded to the plane coil on which the semiconductor element is mounted, the connecting pieces for connecting the conductors adjacent to each other in the inward and outward direction of the plane coil are cut off. However, the following procedure may be adopted. First, the adhesive member and/or the tape member is bonded to the plane coil, and then the connecting pieces for connecting the conductors adjacent to each other in the inward and outward direction of the plane coil are cut off. After that, the semiconductor element is mounted on the plane coil.

According to the present invention, in the process of manufacturing IC cards, it is possible to effectively prevent the deformation of the conductors composing the plane coil. Therefore, it is possible to prevent the occurrence of a short circuit which is caused when the conductors are contacted with each other due to deformation. As a result, the reliability of the IC card can be enhanced and the inspection of the IC card can be simplified.

What is claimed is:

1. A process to manufacture an IC card, comprising:
    forming a plane coil comprising a conductor line configured as several loops in a substantially common plane and having terminals on opposite ends of the conductor line;
    mounting a semiconductor element on the plane coil;
    attaching adhesive tape to a predetermined area of the plane coil so that adjacent loops of the conductor line are held by the adhesive tape, spaced by a predetermined gap therebetween and electrically isolated from each other; and
    disposing the plane coil between a pair of films covering respective, opposite surfaces of the plane coil, at least one of the films having an adhesive layer on a surface facing an opposed surface of the other film and sealing the plane coil, with the semiconductor element mounted thereon, between the pair of films by the adhesive layer, the adhesive tape maintaining the adjacent loops of the conductor line spaced and electrically isolated from each other during the disposing and sealing thereof between the pairs of films.

2. A process as set forth in claim 1, further comprising electrically connecting electrodes of the semiconductor element to the respective terminals of the plane coil, after the semiconductor element is mounted on the plane coil and before the plane coil is sealed by the pair of films.

3. A process as set forth in claim 1, further comprising forming an IC card frame by etching or punching a metal plate so that the IC card frame comprises at least one plane coil comprising the conductor line wound as several loops in substantially the common plane and having respective terminals and a frame connected to and spaced by a predetermined distance from the plane coil so as to support the plane coil; and
    separating the at least one plane coil from the frame.

4. A process as set forth in claim 3, wherein
    the separating further comprises separating an individual plane coil from the frame; and thereafter
    sealing the individual plane coil with the semiconductor element between the pair of films.

5. A process as set forth in claim 4, further comprising:
    sealing a plurality of individual plane coils, positioned in spaced relationship, between the pair of films; and, thereafter
    cutting the films to separate and obtain individual IC cards, each comprising a respective, sealed plane coil.

6. A process as set forth in claim 1, wherein the forming a plane coil further comprises:
    forming a bent portion protruding outwardly or inwardly from the spaced loops of the conductor line of the plane coil.

7. A process as set forth in claim 1, wherein the conductive line has an annulated surface.

8. A process as set forth in claim 1, further comprising forming the plane coil by etching or punching a metal plate so that the plane coil comprises the conductor line wound as several loops in a substantially common plane.

9. A process as set forth in claim 8, wherein the conductive line has an annulated surface.

10. A process for manufacturing an IC card, comprising:
    forming a plane coil of plural loops of a conductor line lying in a substantially common plane and having respective terminals at opposite ends of the conductor line;
    attaching adhesive tape to a predetermined area of the plane coil so that adjacent loops of the conductor line are held by the adhesive tape, spaced by a predetermined gap therebetween and thereby electrically isolated from each other; and
    mounting a semiconductor element on the plane coil, the semiconductor element having electrode terminals thereon connected to respective terminals of the conductor line;
    forming adhesive material on the plane coil and the semiconductor element, mounted thereon, so as to embed same within a layer of the adhesive material having opposite, parallel main surfaces parallel to the plane coil, the adhesive tape maintaining the adjacent loops of the conductor line in the spaced relationship against transverse forces imposed thereon when forming the adhesive material.

11. The process for manufacturing IC cards as recited in claim 10, wherein the forming a plane coil further comprises:
    forming the coil to include straight portions joined at curved corners in a rectangular configuration; and
    attaching the adhesive tape to a predetermined area of each straight line portion and/or at each corner.

12. The process for manufacturing IC cards as recited in claim 10, wherein the forming a plane coil further comprises:
    in each straight line portion of each loop, forming a bent portion, extending transversely to the direction of the straight line portion, the respective bent portions of successive loops being of increased respective lengths so as to protrude in stacked relationship and enhance rigidity of the plane coil.

13. The process for manufacturing IC cards as recited in claim 10 wherein the forming a plane coil further comprises:
    forming connecting pieces integral with and extending between adjacent loops of the plane coil in each straight line portion thereof; and
    after the plane coil is embedded within the adhesive layer, removing the connecting pieces.

14. The process for manufacturing IC cards as recited in claim 13, wherein the forming adhesive material on the plane coil further comprises forming the adhesive material on the plane coil except on surfaces corresponding to the connecting portions.

15. The process for manufacturing an IC card as recited in claim 10, wherein the forming a plane coil further comprises:
    disposing the coil within an outer frame; and
    connecting the outer loop of the plane coil to inwardly extending connectors of the outer frame.

16. The process for manufacturing an IC card as recited in claim 15, wherein the forming a plane coil further comprises:
    forming the coil about an inner frame; and
    connecting an inner loop of the plane coil to outwardly extending connectors of the inner frame.

17. The process for manufacturing an IC card as recited in claim 10, wherein the forming a plane coil further comprises:
    forming the coil about an inner frame; and
    connecting an inner loop of the plane coil to outwardly extending connectors of the inner frame.

* * * * *

UNITED STATES PATENT AND TRADEMARK OFFICE
CERTIFICATE OF CORRECTION

| | |
|---|---|
| PATENT NO. | : 6,797,543 B2 |
| DATED | : September 28, 2004 |
| INVENTOR(S) | : Tetsuichiro Kasahara et al. |

It is certified that error appears in the above-identified patent and that said Letters Patent is hereby corrected as shown below:

Column 5,
Line 53, change "b" to -- be --.

Signed and Sealed this

Third Day of May, 2005

JON W. DUDAS
*Director of the United States Patent and Trademark Office*